United States Patent
Park et al.

(10) Patent No.: US 11,044,804 B2
(45) Date of Patent: Jun. 22, 2021

(54) CONNECTOR ASSEMBLY AND DISPLAY DEVICE HAVING THE SAME

(71) Applicant: SAMSUNG DISPLAY CO., LTD., Yongin-si (KR)

(72) Inventors: Minyoung Park, Busan (KR); Jongmin Shim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 139 days.

(21) Appl. No.: 16/535,910

(22) Filed: Aug. 8, 2019

(65) Prior Publication Data
US 2020/0113042 A1    Apr. 9, 2020

(30) Foreign Application Priority Data
Oct. 4, 2018 (KR) .................... 10-2018-0118478

(51) Int. Cl.
| | |
|---|---|
| *H01R 9/00* | (2006.01) |
| *H05K 1/02* | (2006.01) |
| *H01R 12/79* | (2011.01) |
| *H01R 12/70* | (2011.01) |
| *H05K 1/18* | (2006.01) |
| *H01L 27/32* | (2006.01) |

(52) U.S. Cl.
CPC ....... *H05K 1/0265* (2013.01); *H01R 12/7076* (2013.01); *H01R 12/79* (2013.01); *H05K 1/181* (2013.01); *H01L 27/3244* (2013.01); *H05K 2201/10128* (2013.01); *H05K 2201/10189* (2013.01)

(58) Field of Classification Search
USPC ......................................................... 361/763
See application file for complete search history.

(56) References Cited

U.S. PATENT DOCUMENTS

| 10,127,190 B2 | 11/2018 | Hutton et al. | |
|---|---|---|---|
| 2014/0029226 A1* | 1/2014 | Abe | G02F 1/13454 361/773 |
| 2015/0076570 A1* | 3/2015 | Sunaga | H01L 25/072 257/288 |

FOREIGN PATENT DOCUMENTS

| KR | 10-1411633 | 8/2010 |
|---|---|---|
| KR | 10-2017-0064011 | 6/2017 |

\* cited by examiner

*Primary Examiner* — Andargie M Aychillhum
(74) *Attorney, Agent, or Firm* — Lewis Roca Rothgerber Christie LLP

(57) ABSTRACT

A connector assembly and a display device are provided. A connector assembly includes a first connector comprising a long-side portion at which a plurality of signal terminals is located and a short-side portion at which a power source voltage terminal is located, and a printed circuit board including a plurality of signal printed lines connected to the plurality of signal terminals and a power source voltage printed line connected to the power source voltage terminal, the first connector being arranged on the printed circuit board.

17 Claims, 5 Drawing Sheets

CONNECTOR ASSEMBLY AND DISPLAY DEVICE HAVING THE SAME

CROSS-REFERENCE TO RELATED APPLICATION

This application claims priority to and the benefit of Korean Patent Application No. 10-2018-0118478, filed on Oct. 4, 2018 in the Korean Intellectual Property Office, the entire content of which is hereby incorporated by reference.

BACKGROUND

1. Field

Aspects of embodiments of the inventive concept relate to a connector assembly and a display device having the connector assembly.

2. Description of the Related Art

In recent years, with the development of technology, display products that are smaller, lighter, and have better performance are being produced. A conventional cathode ray tube (CRT) has been widely used in display devices with many advantages in performance and cost. However, as a display device having advantages of miniaturization, light weight, and low power consumption and overcoming the shortcomings of the CRT in terms of miniaturization or portability, for example, a display device may include a liquid crystal display (LCD) or an organic light emitting display.

The LCD includes a liquid crystal display panel for displaying an image using light transmittance of a liquid crystal, and a backlight assembly disposed under the liquid crystal display panel and providing light to the liquid crystal display panel.

The organic light emitting display displays an image using an organic light emitting diode that emits light by recombination of electrons and holes. Such an organic light emitting display device is most often used because it has a fast response speed and is driven with low power consumption.

The organic light emitting diode includes a plurality of pixels, and the plurality of pixels includes organic light emitting diodes that emit light.

A power source voltage is needed to drive the plurality of organic light emitting diodes.

The power source voltage for emitting the organic light emitting diode includes a high power source voltage (ELVDD) and a low power source voltage (ELVSS).

The total current capacity for driving the plurality of organic light emitting diodes is about several tens of amperes, and the current capacity of the organic light emitting display needs to be increased with respect to the power source voltage as the organic light emitting display is enlarged.

SUMMARY

According to exemplary embodiments of the inventive concept, a connector assembly for increasing an allowable current capacity of a power source voltage is provided.

According to exemplary embodiments of the inventive concept, a display device having the above-described connector assembly is provided.

According to one or more exemplary embodiments of the inventive concept, a connector assembly includes a first connector comprising a long-side portion at which a plurality of signal terminals is located and a short-side portion at which a power source voltage terminal is located, and a printed circuit board comprising a plurality of signal printed lines connected to the plurality of signal terminals and a power source voltage printed line connected to the power source voltage terminal, the first connector being arranged on the printed circuit board.

In an exemplary embodiment, the first connector may further include a ground terminal located at the short-side portion.

In an exemplary embodiment, the first connector may further include another power source voltage terminal located at an end portion of the long-side portion adjacent to the short-side portion.

In an exemplary embodiment, the power source voltage printed line may be connected to the power source voltage terminal located at the end portion of the long-side portion and the power source voltage terminal located at the short-side portion, and the power source voltage printed line may be located at an area of the printed circuit board defined by the end portion of the long-side portion and the short-side portion.

In an exemplary embodiment, the first connector may include a high-power source voltage terminal located at a first short-side portion and a low-power source voltage terminal located at a second short-side portion opposite to the first short-side portion.

In an exemplary embodiment, the printed circuit board may include a first power source voltage printed line connected to a first high-power source voltage terminal located at a first end portion of the long-side portion and a second high-power source voltage terminal located at a first short-side portion of the long-side portion adjacent to the first end portion of the long-side portion, and a second power source voltage printed line connected to a first low-power source voltage terminal located at a second end portion of the long-side portion and a second short-side portion of the long-side portion adjacent to a second end portion of the long-side portion.

In an exemplary embodiment, the first power source voltage printed line may be located at a first line area of the printed circuit board defined by the first end portion of the long-side portion and the first short-side portion, and the second power source voltage printed line may be located at a second line area of the printed circuit board defined by the second end portion of the long-side portion and the second short-side portion.

In an exemplary embodiment, the connector assembly may further include a second connector insertable into a combining opening of the first connector to be coupled with the first connector.

In an exemplary embodiment, the second connector may include a first side-terminal connected to a signal terminal of the plurality of signal terminals located at the long-side portion of the first connector, and a second side-terminal connected to the power source voltage terminal located at the short-side portion of the first connector.

According to one or more exemplary embodiments of the inventive concept, a display device includes a first connector comprising a long-side portion at which a plurality of signal terminals is located and a short-side portion at which a power source voltage terminal to receive an emission power source voltage is located, a printed circuit board comprising a plurality of signal printed lines connected to the plurality of signal terminals and a power source voltage printed line connected to the power source voltage terminal, the first connector being arranged on the printed circuit board, the display panel comprising an organic light-emitting diode to emit a light by the emission power source voltage, and a data driving circuit film connecting the printed circuit board and the display panel and transferring the emission power source voltage to the display panel.

In an exemplary embodiment, the first connector may further include a ground terminal located at the short-side portion.

In an exemplary embodiment, the first connector may further include another power source voltage terminal located at an end portion of the long-side portion adjacent to the short-side portion.

In an exemplary embodiment, the power source voltage printed line may be connected to the power source voltage terminal located at the end portion of the long-side portion and the power source voltage terminal located at the short-side portion, and the power source voltage printed line may be located at an area of the printed circuit board defined by the end portion of the long-side portion and the short-side portion.

In an exemplary embodiment, the display panel may further include a pixel circuit. The pixel circuit may include a switching transistor comprising a control electrode connected to a scan line and a first electrode connected to the data line switching transistor, a driving transistor comprising a control electrode connected to a second electrode of the switching transistor, a first electrode receiving a first emission power source voltage and a second electrode connected to an anode electrode of the organic light-emitting diode and a capacitor connected to the control electrode of the driving transistor, wherein a cathode electrode of the organic light-emitting diode may receive a second emission power source voltage.

In an exemplary embodiment, the first connector may include a high-power source voltage terminal located at a first short-side portion to receive the first emission power source voltage and a low-power source voltage terminal located at a second short-side portion opposite to the first short-side portion to receive the second emission power source voltage.

In an exemplary embodiment, the printed circuit board may include a first power source voltage printed line connected to a first high-power source voltage terminal located at a first end portion of the long-side portion and a second high-power source voltage terminal located at a first short-side portion of the long-side portion adjacent to the first end portion of the long-side portion, and a second power source voltage printed line connected to a first low-power source voltage terminal located at a second end portion of the long-side portion and a second short-side portion of the long-side portion adjacent to a second end portion of the long-side portion.

In an exemplary embodiment, the first power source voltage printed line may be located at a first line area of the printed circuit board defined by the first end portion of the long-side portion and the first short-side portion, and the second power source voltage printed line may be located at a second line area of the printed circuit board defined by the second end portion of the long-side portion and the second short-side portion.

In an exemplary embodiment, the display device may further include a second connector insertable into a combining opening of the first connector to be coupled with the first connector.

In an exemplary embodiment, the second connector may include a first side-terminal connected to a signal terminal of the plurality of signal terminals located at the long-side portion of the first connector and a second side-terminal connected to the power source voltage terminal located at the short-side portion of the first connector.

According to an aspect of embodiments of the present disclosure, in the connector assembly and the display device including the connector assembly, the width of the power source voltage terminal may be extended by arranging the power source voltage terminal at the short-side portion of the connector.

According to another aspect of embodiments of the present disclosure, the power source voltage terminals formed at the end portion of the long side and at the short side of the connector may extend the width of the power source voltage printed line formed on the printed circuit board.

Therefore, as the width of the power source voltage printed line is expanded, the current capacity of the emission power source voltage may be increased.

BRIEF DESCRIPTION OF THE DRAWINGS

The above and other features and aspects of the inventive concept will become more apparent by describing in further detail some exemplary embodiments thereof with reference to the accompanying drawings, in which.

DETAILED DESCRIPTION

Figure 1:
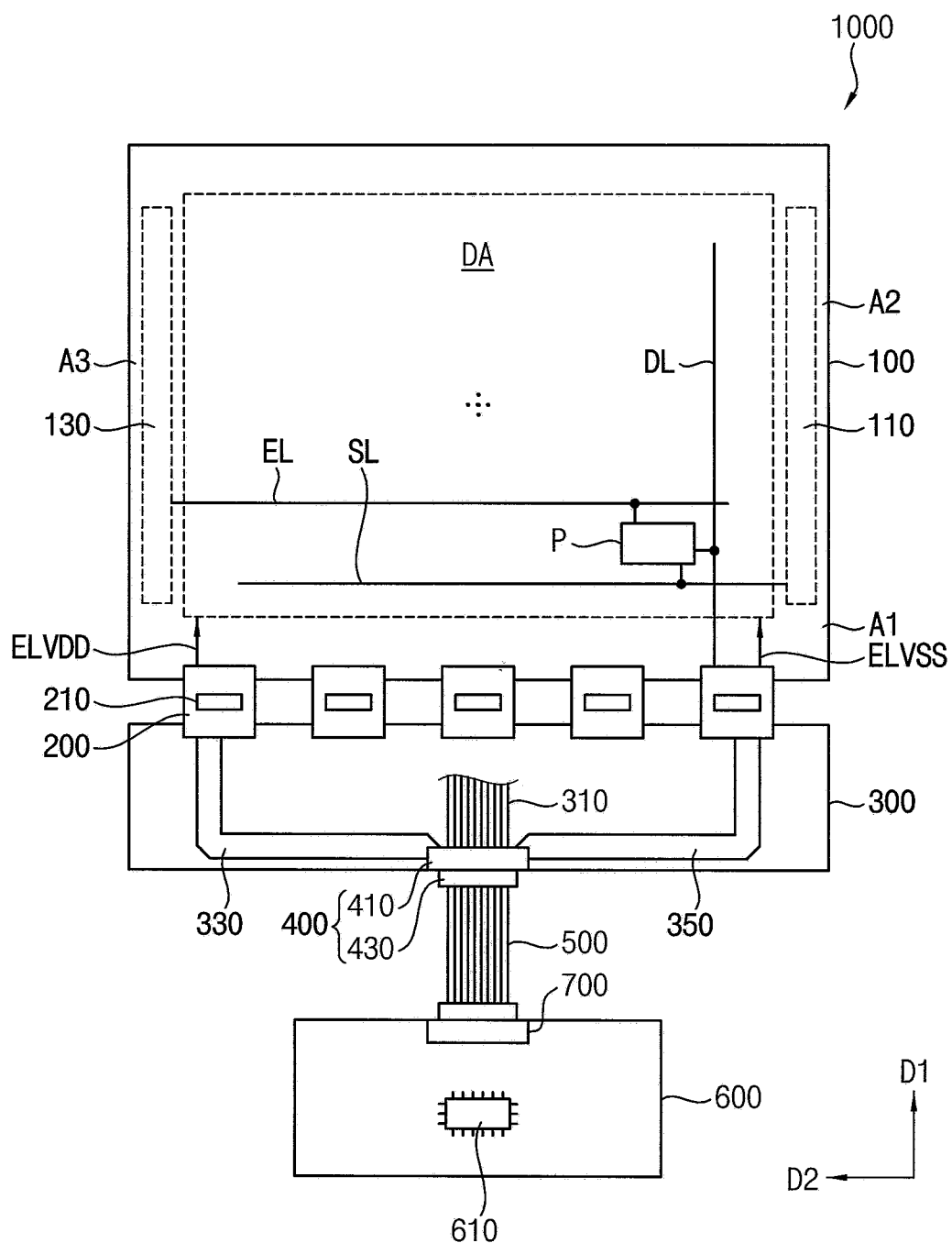
FIG. 1 is a plan view illustrating a display device according to an exemplary embodiment.

Herein, the inventive concept will be explained in further detail with reference to the accompanying drawings.

In the figures, the thickness, ratio, and dimensions of components may be exaggerated for clarity of illustration. As used herein, the term "and/or" includes any and all combinations of one or more of the associated listed items.

As used herein, "include" or "comprise" specifies a property, a fixed number, a step, an operation, an element, a component, or a combination thereof, but does not exclude other properties, fixed numbers, steps, operations, elements, components, or combinations thereof.

Where an element is described as being related to another element, such as being "on" another element or "located on" a different element or a layer, this includes both a case in which an element is located directly on another element or a layer and a case in which an element is located on another element via another layer or still another element. In contrast, where an element is described as being related to another element, such as being "directly on" another element or "located directly on" a different element or a layer, this indicates a case in which an element is located on another element or a layer with no intervening element or layer therebetween.

Throughout the specification, the same reference numerals are used for the same or similar parts.

It is to be understood that, although the terms "first," "second," etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It is to be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting of example embodiments. As used herein, the singular forms "a," "an," and "the" are intended to include the plural forms as well, unless the context clearly indicates otherwise.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a plan view illustrating a display device according to an exemplary embodiment.

Figure 2:
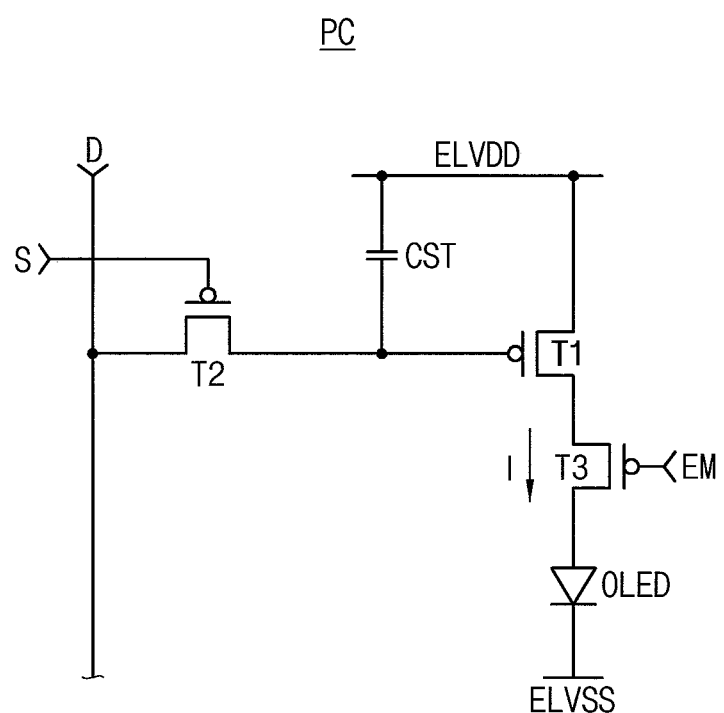
FIG. 2 is a circuit diagram illustrating a pixel circuit of a display device according to an exemplary embodiment.

FIG. 2 is a circuit diagram illustrating a pixel circuit of a display device according to an exemplary embodiment.

Referring to FIGS. 1 and 2, a display device 1000 according to an exemplary embodiment may include a display panel 100, a data driving circuit film 200, a first printed circuit board 300, a first connector unit 400, a flexible circuit film 500, a second printed circuit board 600, and a second connector unit 700.

The display panel 100 may include a display area DA and a peripheral area surrounding the display area DA.

The display area DA may include a plurality of data lines DL, a plurality of scan lines SL, a plurality of emission control lines EL, and a plurality of pixels P.

The plurality of data lines DL extends in a first direction D1 and is arranged in a second direction D2 crossing the first direction D1.

The plurality of scan lines SL extends in the second direction D2 and is arranged in the first direction D1.

The plurality of emission control lines EL may extend in the second direction D2 and be arranged in the first direction D1.

The plurality of pixels P may be arranged a matrix type which includes a plurality of pixel rows and a plurality of pixel columns.

Each of the pixels P may be connected to a scan line SL, a data line DL, and an emission control line EL. The pixel P may include a pixel circuit PC.

For example, as shown in FIG. 2, the pixel circuit PC may include an organic light emitting diode OLED, a driving transistor T1, a capacitor CST, a switching transistor T2, and an emission control transistor T3.

The driving transistor T1 includes a control electrode connected to the switching transistor T2, a first electrode for receiving the first emission power source voltage ELVDD, and a second electrode connected to the emission control transistor T3.

The first emission power source voltage ELVDD is power source voltage having a high level.

The capacitor CST includes a first electrode receiving the first emission power source voltage ELVDD and a second electrode connected to the control electrode of the driving transistor T1.

The switching transistor T2 includes a control electrode receiving a scan signal S, a first electrode receiving a data voltage D, and a second electrode connected to the control electrode of the driving transistor T1.

The emission control transistor T3 includes a control electrode for receiving an emission control signal EM, a first electrode connected to the second electrode of the driving transistor T1, and a second electrode connected to the organic light emitting diode OLED.

The organic light emitting diode OLED includes an anode electrode connected to the emission control transistor T3 and a cathode electrode receiving a second emission power source voltage ELVSS. The second emission power source voltage ELVSS is a power source voltage having a low level.

When the emission control transistor T3 is turned on, a current I flowing in the driving transistor T1 is applied to the organic light emitting diode OLED, and the organic light emitting diode OLED emits light.

The peripheral area PA of the display panel 100 may include a first area A1, a second area A2, and a third area A3.

The first area A1 is an area adjacent to an end portion of the data line DL, and the data driving circuit film 200 is disposed in the first area A1.

The second area A2 is an area adjacent to an end portion of the scan line SL, and a scan driving circuit 110 for providing a scan signal to the scan line SL is disposed in the second area A2.

In an embodiment, the scan driver circuit 110 may include a plurality of transistors formed in the second area A2 directly in a same manufacturing process as the transistors included in the pixel circuit PC.

The third area A3 is an area facing the second area A2 and adjacent to an end portion of the emission control line EL, and an emission driving circuit 130 providing the emission control signal to the emission control line EL is disposed in the third area A3.

In an embodiment, the emission driving circuit 130 may include a plurality of transistors formed directly on the third area A3 in a same manufacturing process as the transistors included in the pixel circuit PC.

The data driving circuit film 200 may include a data driver chip 210 mounted on the data driving circuit film 200. A first end portion of the data driving circuit film 200 is connected to the first printed circuit board 300, and a second end portion of the data driving circuit film 200 is connected to the first area A1 of the display panel 100.

The data driver chip 210 generates a data voltage using an image signal and a control signal provided from the second printed circuit board 600 and provides the data voltage to the data line DL of the display panel 100.

In an embodiment, among the plurality of data driving circuit films, a data driving circuit film 200 disposed at an outer periphery may be connected to power source voltage lines formed on the display panel 100.

The first and second emission power source voltages ELVDD and ELVSS may be transmitted to the display panel 100 through the data driving circuit film 200.

The first printed circuit board 300 includes a plurality of printed lines 310, 330, and 350. The data driving circuit film 200 connected to the plurality of printed lines 310, 330 and 350 is disposed at the first end portion of the first printed circuit board 300. A first connector unit 400 connected to the plurality of printed lines 310, 330, and 350 is disposed in the second end portion of the first printed circuit board 300.

The plurality of printed lines 310, 330, and 350 includes a plurality of signal printed lines 310 for transmitting image signals and control signals. The plurality of printed lines 310, 330 and 350 includes a plurality of power source voltage printed lines for transmitting first and second emission power source voltages ELVDD and ELVSS.

The power source voltage printed lines include a first power source voltage printed line 330 for transmitting the first emission power source voltage ELVDD and a second power source voltage printed line 350 for transmitting the second emission power source voltage ELVSS.

The first and second power source voltage printed lines 330 and 350 are connected to signal lines formed on the data driving circuit film 200.

The first and second emission power source voltages ELVDD and ELVSS applied to the first and second power source voltage printed lines 330 and 350 may be provided to the display panel 100 through the data driving circuit film 200.

The first connector unit 400 is disposed on the first printed circuit board 300 and electrically connected to the plurality of printed lines 310, 330, and 350.

The first connector unit 400 includes a first connector 410 and a second connector 430. The first connector 410 is connected to the first printed circuit board 300, and the second connector 430 is combined with the first connector 410.

The first connector 410 includes a body formed with a combining hole or opening into which the second connector 430 is inserted and a plurality of terminals connected to a plurality of printed lines 310, 330, and 350 of the first printed circuit board 300.

The plurality of terminals is formed inside the combining hole of the first connector 410 and protrudes outside the first connector 410.

The plurality of terminals includes signal terminals connected to the signal printed lines 310, and a high-power source voltage terminal and a low-power source voltage terminal connected to the first and second power source voltage printed lines 330 and 350, respectively.

The signal terminals may be arranged in a long-side portion of the first connector 410.

The high-power source voltage terminals may be disposed in at least one of a first end portion of the long-side portion and a first short-side portion of the first connector 410. The low-power source voltage terminals may be disposed in at least one of a second end portion of the long-side portion and a second short-side portion of the first connector 410.

The flexible cable 500 may electrically connect the first printed circuit board 300 and the second printed circuit board 600.

According to one exemplary embodiment, the flexible cable 500 may be a flexible flat cable (FFC). The flexible cable 500 may include a plurality of central conductors, such as of copper.

On both sides of a central conductor, an insulating film having a flexible and insulating film of a material such as polyethylene terephthalate (PET) may be adhered and laminated with an adhesive layer.

The flexible cable 500 may be connected to the first printed circuit board 300 and the second printed circuit board 600 through the first and second connector units 400 and 700.

The second printed circuit board 600 is mounted with a main driving circuit 610 that controls the overall driving of the display device. The second connector unit 700 electrically connected to the main driving circuit 610 is disposed at an end portion of the second printed circuit board 600.

According to an exemplary embodiment, the power source voltage terminals included in the first connector unit 400 may be disposed in the end portion of the long-side portion and the short-side portion of the first connector unit 400 adjacent the end portion of the long-side portion and with respect to the first connector unit 400.

Therefore, a width of the power source voltage printed line 330 and 350 of the first printed circuit board 300 connected to the power source voltage terminals disposed in the end portion of the long-side portion and the short-side portion adjacent to the end portion of the long-side portion may be expanded.

By expanding the width of the power source voltage printed line, the current capacity of the power source voltage applied to the power source voltage printed line may be increased.

All the organic light emitting diodes of the display panel emit the light by the first emission power source voltage ELVDD and the second emission power source voltage ELVSS.

For example, the organic light emitting diode OLED has the second emission power source voltage ELVSS maintained at a voltage of about −6 V, and when the organic light emitting diode OLED is turned on, the first emission power source voltage ELVDD of about 28 V to about 30 V is applied and the second emission power source voltage ELVSS is switched to a voltage of about −6 V.

According to a large-sized display panel, the first and second emission power source voltages ELVDD and ELVSS may have a total maximum current capacity of about 30 A.

An allowable maximum current is determined by a width and a thickness of the connector's terminal, and the current per terminal may be about 0.5 A.

Accordingly, when the maximum current consumption of the large-sized display panel is about 30 A, the connector needs about 60 terminals or more for the transmission of the first and second emission power source voltages ELVDD and ELVSS.

According to an exemplary embodiment, the power source voltage terminals having the extended width and thickness are disposed in the short-side portion of the connector. Thus, the width of the power source voltage printed line of the printed circuit board connected to the power source voltage terminal may be expanded.

Accordingly, the allowable current capacity of the emission power source voltages ELVDD and ELVSS may increase.

Figure 3:
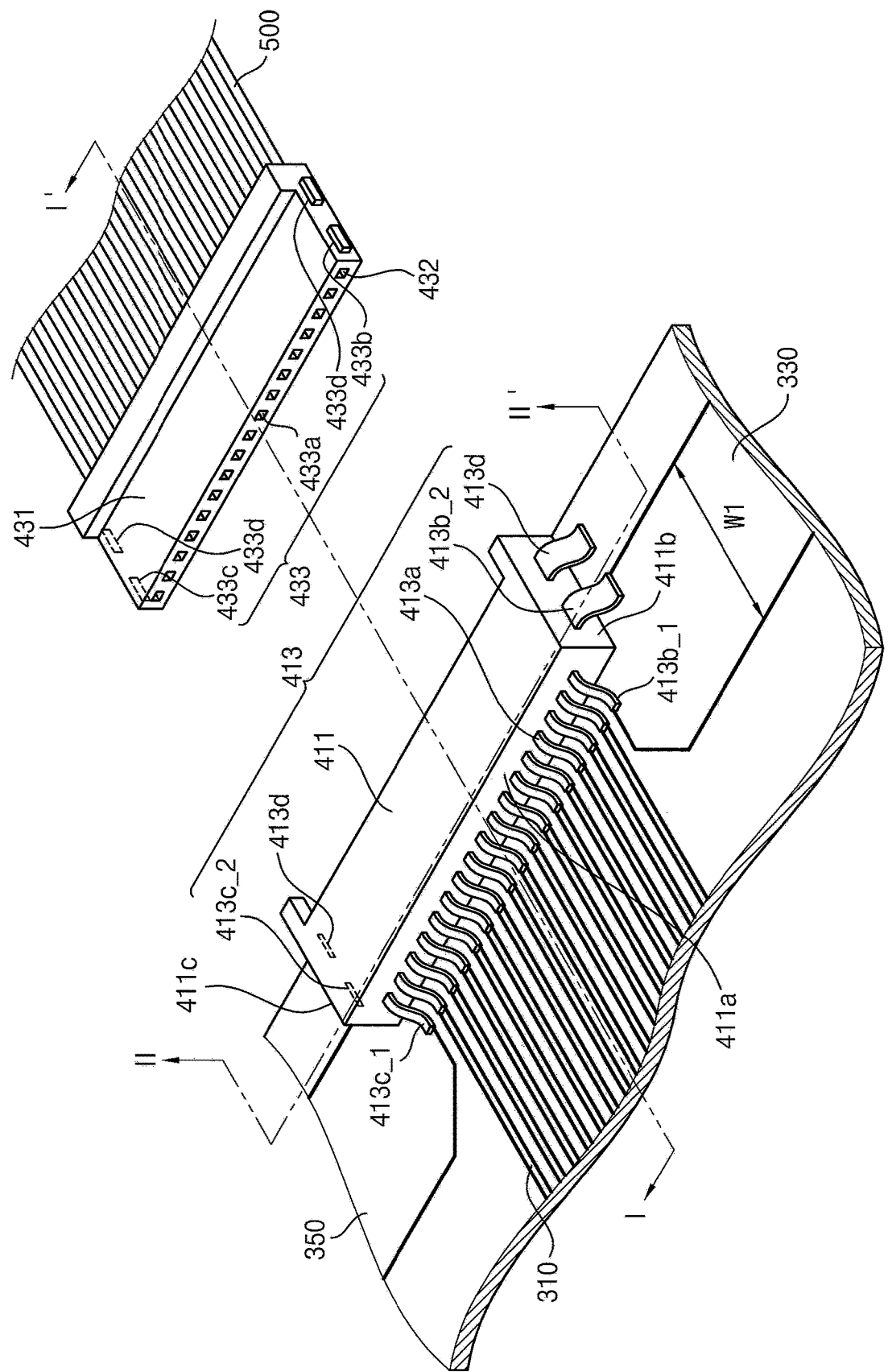
FIG. 3 is a perspective view illustrating a connector assembly according to an exemplary embodiment.
Figure 4:
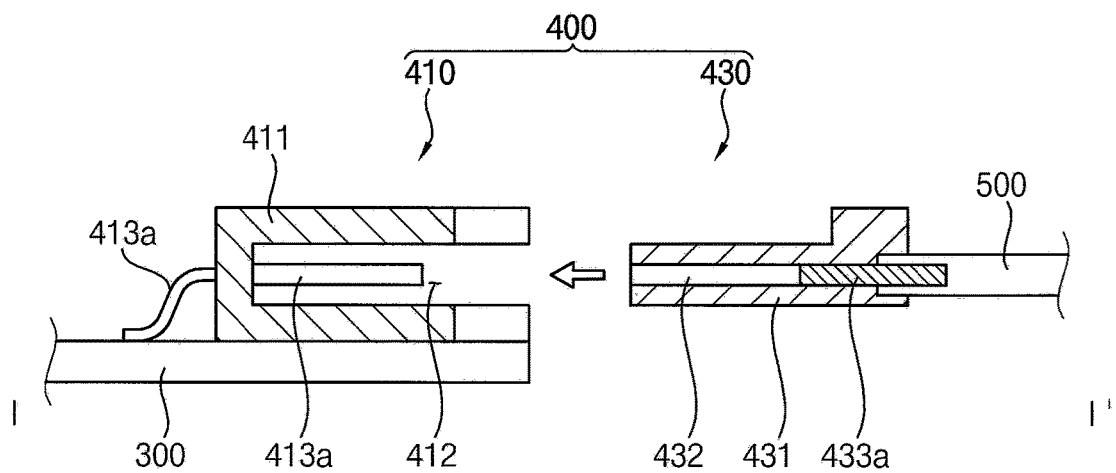
FIG. 4 is a cross-sectional view of the connector assembly taken along the line I-I' of FIG. 3.

FIG. 3 is a perspective view illustrating a connector assembly according to an exemplary embodiment; FIG. 4 is a cross-sectional view of the connector assembly taken along the line I-I' of FIG. 3; and FIG. 5 is a cross-sectional view of the connector assembly taken along the line II-II' of FIG. 3.

Figure 5:
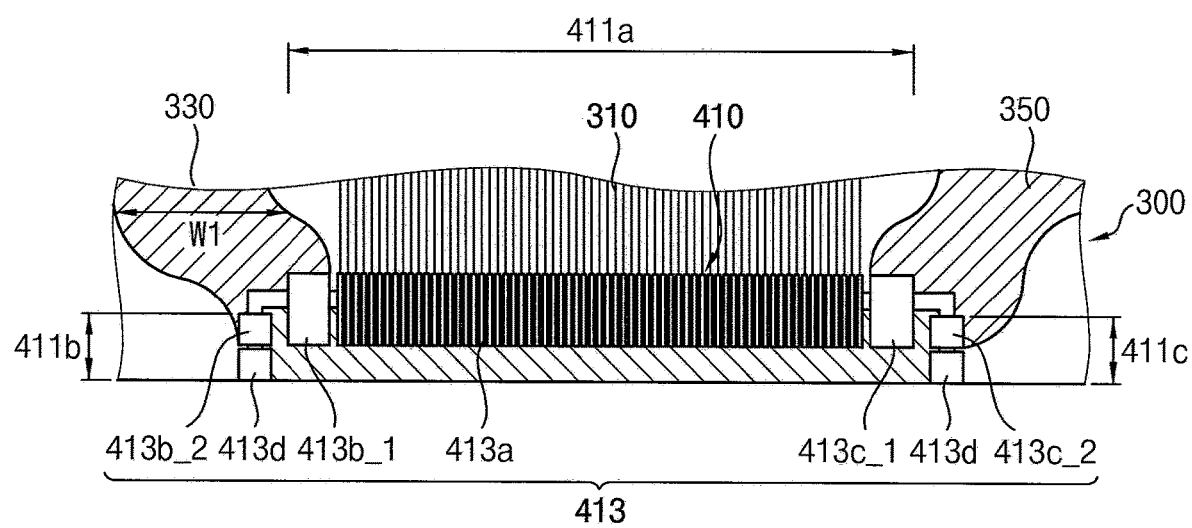
FIG. 5 is a cross-sectional view of the connector assembly taken along a line II-II' of FIG. 3.

Referring to FIGS. 3, 4, and 5, a connector assembly may include the first printed circuit board 300 and the first connector unit 400.

The first connector unit 400 includes the first connector 410 connected to the first printed circuit board 300 and the second connector 430 combined with the first connector 410.

The first connector 410 includes a first body 411 and a plurality of first terminals 413.

The first body 411 has a rectangular shape and is connected to the first printed circuit board 300.

The first body 411 is formed with a combining hole or opening 412 for coupling with the second connector 430.

In an embodiment, the combining hole 412 has a same rectangular shape as the first connector 410.

The plurality of first terminals 413 may be disposed within the combining hole 412 and may extend outside the first connector 410 to connect with printed lines of the first printed circuit board 300.

In an embodiment, the plurality of first terminals 413 includes a plurality of signal terminals 413a connected to the signal printed line 310 and at least one high-voltage voltage terminal, or high-power source voltage terminal, 413b_1 and 413b_2 connected to the first power source voltage printed line 330, and at least one low-voltage voltage terminal, or low-power source voltage terminal, 413c_1 and 413c_2 connected to the second power source voltage printed line 350, and at least one ground terminal 413d.

The signal terminal 413a is arranged in a long-side portion 411a of the first connector 410 along a longitudinal direction of the long-side portion 411a.

In an embodiment, the at least one high-power source voltage terminal includes a first high-power source voltage terminal 413b_1 disposed in a first end portion of the long-side portion 411a and a second high-power source voltage terminal 413b_2 disposed in a first short-side portion 411b of the first connector 410 adjacent to the first end portion of the long-side portion 411a.

In an embodiment, the at least one low-power source voltage terminal includes a first low-power source voltage terminal 413c_1 disposed in a second end portion of the long-side portion 411a and a second low-power source voltage terminal 413c_2 disposed in a second short-side portion 411c of the first connector 410 adjacent to the second end portion of the long-side portion 411a.

In an embodiment, the at least one ground terminal includes a ground terminal 413d disposed in the first short-side portion 411b of the first connector 410 and a ground terminal 413d disposed in the second short-side portion 411c of the first connector 410.

The second connector 430 includes a second body 431 and a plurality of second terminals 433.

The second body 431 is connected to the flexible cable 500.

The second body 431 is inserted into the combining hole 412 of the first connector 410 and connected to the first connector 410. The second body 431 includes the plurality of second terminals 433 connected to the plurality of first terminals 413 of the first connector 410.

The plurality of second terminals 433 includes first side-terminals 433a and second side-terminals 433b, 433c, and 433d.

The first side-terminals 433a may be connected to the plurality of signal terminals 413a, the first high-power source voltage terminal 413b_1 and the first low-power source voltage terminal 413c_1 arranged in the long-side portion 411a of the first connector 410.

The first side-terminal 433a may be disposed in a groove 432 formed in the second body 431 for insertion of the terminal of the first connector 410 having a protruding shaped.

The second side-terminals 433b, 433c, and 433d are connected to the second high-power source voltage terminal 413b_2, the second low-power source voltage terminal 413c_2, and the ground terminal 413d, respectively, disposed in the short-side portions 411b and 411c of the first connector 410.

The first high-power source voltage terminal 413b_1 of the first connector 410 is disposed in the first end portion of the long-side portion 411a. The second high-power source voltage terminal 413b_2 of the first connector 410 is disposed in the first short-side portion 411b of the first connector 410.

The first power source voltage printed line 330 of the first printed circuit board 300, which is connected to the first and second high-power source voltage terminals 413b_1 and 413b_2 of the first connector 410 may have an extended width W1 corresponding to an integrated area of a first line area defined by the first end portion of the long-side portion 411a and a second line area defined by the first short-side portion 411b of the first connector 410.

The first low-power source voltage terminal 413c_1 of the first connector 410 is disposed in the second end portion of the long-side portion 411a. The second low-power source voltage terminal 413c_2 of the first connector 410 is disposed in the second short-side portion 411c of the first connector 410.

The second power source voltage printed line 350 of the first printed circuit board 300, which is connected to the first and second low-power source voltage terminals 413c_1 and 413c_2 of the first connector 410 may have an extended width W1 corresponding to an integrated area of a first line area defined by the second end portion of the long-side portion 411a and a second line area defined by the second short-side portion 411c of the first connector 410.

According to an exemplary embodiment, the width and thickness of the power source voltage terminal may be expanded by forming a power source voltage terminal in the short-side portion of the connector that is wider than the long-side portion of the connector having a plurality of signal terminals.

In addition, the power source voltage terminals may be disposed in an end portion of a long side of the connector and a short side portion of the connector. Therefore, the width of the power source voltage printed line of the printed circuit board connected to the power source voltage terminals may be extended.

Accordingly, as the width of the power source voltage printed line is expanded, the current capacity of the emission power source voltage may be increased.

Alternatively, according to one exemplary embodiment, when the current capacity for the power source voltage need not be increased, the power source voltage terminal formed on the short-side portion of the connector may be used as the ground terminal. In this case, as the area of the ground terminal increases, a stable circuit may be achieved.

Figure 6:
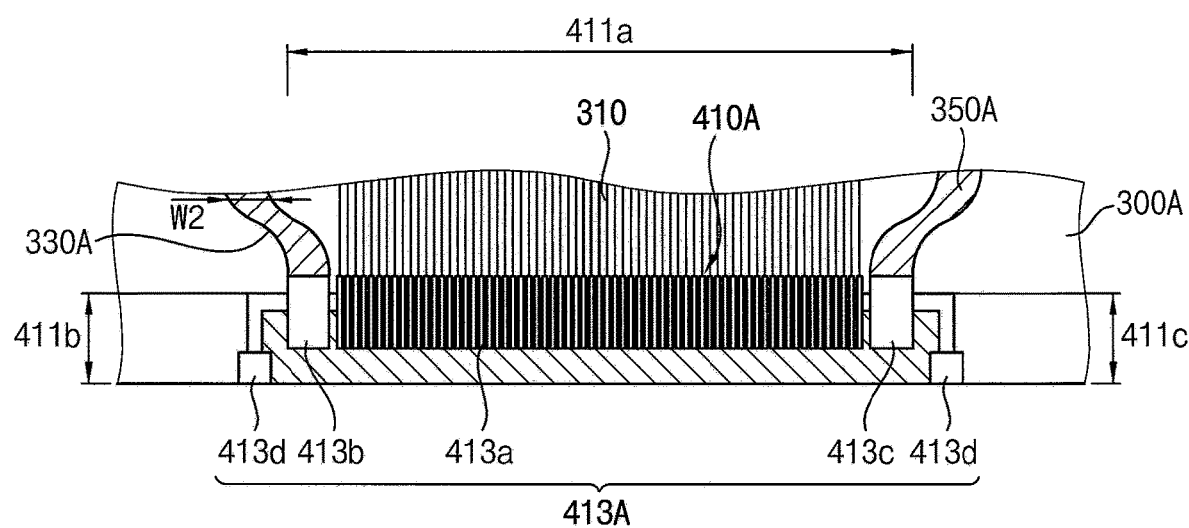
FIG. 6 is a cross-sectional view illustrating a connector assembly according to another exemplary embodiment.

FIG. 6 is a cross-sectional view illustrating a connector assembly according to another exemplary embodiment.

Referring to FIG. 6, according to another exemplary embodiment, a connector assembly may include a first connector 410A and a first printed circuit board 300A.

The first connector 410A includes a plurality of first terminals 413A.

The plurality of first terminals 413A includes a signal terminal 413a connected to the signal printed line 310, a high-power source voltage terminal 413b connected to a first power source voltage printed line 330A, a low-power source voltage terminal 413c connected to a second power source voltage printed line 350A, and at least one ground terminal 413d.

The high-power source voltage terminal 413b is disposed in a first end portion of a long-side portion 411a of the first connector 410A.

The low-power source voltage terminal 413c is disposed in a second end portion of the long-side portion 411a of the first connector 410A.

The at least one ground terminal 413d is disposed in a first short-side portion 411b of the first connector 410A and a second short-side portion 411c of the first connector 410A.

The high-power source voltage terminal 413b of the first connector 410A is disposed in the first end portion of the long-side portion 411a of the first connector 410A. Accordingly, the first power source voltage printed line 330A of the first printed circuit board 300A connected to the high-power source voltage terminal 413b of the first connector 410A has a width W2 corresponding to an area defined by the first end portion of the long-side portion 411a.

The low-power source voltage terminal 413c of the first connector 410A is disposed in the second end portion of the long-side portion 411a of the first connector 410A. Accordingly, the second power source voltage printed line 350A of the first printed circuit board 300A connected to the low-power source voltage terminal 413c of the first connector 410A has a width W2 corresponding to an area defined by the second end portion of the long-side portion 411a.

In the exemplary embodiment shown in FIG. 5, the first and second power source voltage printed lines 330 and 350 may be connected to a power source voltage terminal additionally disposed on the short-side portion of the connector to have the extended width W1.

The extended width W1 of the power source voltage printed line according to the exemplary embodiment may be formed wider than the width W2 of the power source voltage printed line according to the exemplary embodiment of FIG. 6.

Therefore, the current capacity of the emission power source voltage may be increased as the width of the power source voltage printed line formed on the printed circuit board is expanded.

According to the connector assembly and the display device including the connector assembly according to exemplary embodiments of the present invention, the width of the power source voltage terminal may be extended by disposing the power source voltage terminal in the short-side portion of the connector.

In addition, the power source voltage terminals formed in the end portion of the long side and in the short side of the connector may extend the width of the power source voltage printed line formed on the printed circuit board.

Therefore, as the width of the power source voltage printed line is expanded, the current capacity of the emission power source voltage may be increased.

The present inventive concept may be applied to a display device and an electronic device having the display device. For example, the present inventive concept may be applied to a computer monitor, a laptop, a digital camera, a cellular phone, a smartphone, a smart pad, a television, a personal digital assistant (PDA), a portable multimedia player (PMP), a MP3 player, a navigation system, a game console, a video phone, etc.

The foregoing is illustrative of the inventive concept and is not to be construed as limiting thereof. Although some exemplary embodiments of the inventive concept have been described, those skilled in the art will readily appreciate that many modifications are possible in the exemplary embodiments without materially departing from the novel teachings and advantages of the inventive concept. Accordingly, all such modifications are intended to be included within the scope of the inventive concept as set forth in the claims. Therefore, it is to be understood that the foregoing is illustrative of the inventive concept and is not to be construed as limited to the exemplary embodiments disclosed, and that modifications to the disclosed exemplary embodiments, as well as other exemplary embodiments, are intended to be included within the scope of the appended claims. The inventive concept is set forth in the following claims, with equivalents of the claims to be included therein.

What is claimed is:

1. A connector assembly comprising:
   a first connector comprising a long-side portion at which a plurality of signal terminals is located and a first short-side portion at which a power source voltage terminal is located; and
   a printed circuit board comprising a plurality of signal printed lines connected to the plurality of signal terminals and a power source voltage printed line connected to the power source voltage terminal, the first connector being arranged on the printed circuit board.

2. The connector assembly of claim 1, wherein the first connector further comprises a ground terminal located at the first short-side portion.

3. A connector assembly comprising: a first connector comprising a long-side portion at which a plurality of signal terminals is located and a first short-side portion at which a power source voltage terminal is located; and a printed circuit board comprising a plurality of signal printed lines connected to the plurality of signal terminals and a power source voltage printed line connected to the 0 power source voltage terminal, the first connector being arranged on the printed circuit board, further comprising a second connector insertable into a combining opening of the first connector to be coupled with the first connector.

4. The connector assembly of claim 3, wherein the power source voltage printed line is connected to the another power source voltage terminal located at the first end portion of the long-side portion and the power source voltage terminal located at the first short-side portion, and
   the power source voltage printed line is located at an area of the printed circuit board defined by the first end portion of the long-side portion and the first short-side portion.

5. The connector assembly of claim 3, wherein the power source voltage terminal comprises a high-power source voltage terminal located at the first short-side portion, and the first connector further comprises a low-power source voltage terminal located at a second short-side portion opposite to the first short-side portion.

6. The connector assembly of claim 5, wherein the power source voltage printed line comprises a first power source voltage printed line connected to the another power source voltage terminal located at the first end portion of the long-side portion that is a first high-power source voltage terminal and the power source voltage terminal located at the first short-side portion that is a second high-power source voltage terminal, and the printed circuit board further comprises a second power source voltage printed line connected to a first low-power source voltage terminal located at a second end portion of the long-side portion and a second low-power source voltage terminal located at a second short-side portion of the first connector opposite the first short-side portion.

7. The connector assembly of claim 6, wherein the first power source voltage printed line is located at a first line area of the printed circuit board defined by the first end portion of the long-side portion and the first short-side portion, and the second power source voltage printed line is located at a second line area of the printed circuit board defined by the second end portion of the long-side portion and the second short-side portion.

8. The connector assembly of claim 1, wherein the second connector comprises a first side-terminal connected to a signal terminal of the plurality of signal terminals located at the long-side portion of the first connector, and a second side-terminal connected to the power source voltage terminal located at the short-side portion of the first connector.

9. A display device comprising: a first connector comprising a long-side portion at which a plurality of signal terminals is located and a first short-side portion at which a power source voltage terminal to receive an emission power source voltage is located; a printed circuit board comprising a plurality of signal printed lines connected to 0 the plurality of signal terminals and a power source voltage printed line connected to the power source voltage terminal, the first connector being arranged on the printed circuit board; a display panel comprising an organic light-emitting diode to emit a light by the emission power source voltage; and a data driving circuit film connecting the printed circuit board and the display panel and transferring the emission power source voltage to the display panel, further comprising a second connector insertable into a combining opening of the first connector to be coupled with the first connector.

10. The display device of claim 9, wherein the first connector further comprises a ground terminal located at the first short-side portion.

11. The display device of claim 9, wherein the first connector further comprises another power source voltage terminal located at a first end portion of the long-side portion adjacent to the first short-side portion.

12. The display device of claim 11, wherein the power source voltage printed line is connected to the another power source voltage terminal located at the first end portion of the long-side portion and the power source voltage terminal located at the first short-side portion, and the power source voltage printed line is located at an area of the printed circuit board defined by the first end portion of the long-side portion and the first short-side portion.

13. The display device of claim 9, wherein the display panel further comprises a pixel circuit, the pixel circuit comprising:

a switching transistor comprising a control electrode connected to a scan line and a first electrode connected to the data line switching transistor;

a driving transistor comprising a control electrode connected to a second electrode of the switching transistor, a first electrode receiving a first emission power source voltage and a second electrode connected to an anode electrode of the organic light-emitting diode; and a capacitor connected to the control electrode of the driving transistor, wherein a cathode electrode of the organic light-emitting diode receives a second emission power source voltage.

14. The display device of claim 13, wherein the power source voltage terminal comprises a high-power source voltage terminal located at the first short-side portion to receive the first emission power source voltage, and the first connector further comprises a low-power source voltage terminal located at a second short-side portion opposite to the first short-side portion to receive the second emission power source voltage.

15. The display device of claim 14, wherein the power source voltage printed line comprises a first power source voltage printed line connected to the another power source voltage terminal located at the first end portion of the long-side portion that is a first high-power source voltage terminal and the power source voltage terminal located at the first short-side portion that is a second high-power source voltage terminal, and the printed circuit board further comprises a second power source voltage printed line connected to a first low-power source voltage terminal located at a second end portion of the long-side portion and a second low-power source voltage terminal located at a second short-side portion of the first connector opposite the first short-side portion.

16. The display device of claim 15, wherein the first power source voltage printed line is located at a first line area of the printed circuit board defined by the first end portion of the long-side portion and the first short-side portion, and the second power source voltage printed line is located at a second line area of the printed circuit board defined by the second end portion of the long-side portion and the second short-side portion.

17. The display device of claim 9, wherein the second connector comprises a first side-terminal connected to a signal terminal of the plurality of signal terminals located at the long-side portion of the first connector and a second side-terminal connected to the power source voltage terminal located at the short-side portion of the first connector.

* * * * *